United States Patent [19]

Lau

[11] Patent Number: 4,695,217
[45] Date of Patent: Sep. 22, 1987

[54] SEMICONDUCTOR WAFER TRANSFER APPARATUS

[76] Inventor: John J. Lau, 13350 Floyd Cir., Dallas, Tex. 75243

[21] Appl. No.: 553,790

[22] Filed: Nov. 21, 1983

[51] Int. Cl.$^4$ .............................................. B65G 65/00
[52] U.S. Cl. .................................. 414/404; 294/87.1; 414/417
[58] Field of Search ............... 414/403, 404, 267, 416, 414/417, 422, 287; 294/87.1; 221/295, 296, 277, 298

[56] References Cited

U.S. PATENT DOCUMENTS

| | | | |
|---|---|---|---|
| 3,340,176 | 9/1967 | Belluso et al. | 414/417 X |
| 3,934,733 | 1/1976 | Worden | 414/405 |
| 3,949,891 | 4/1976 | Butler et al. | 414/405 |
| 4,431,361 | 2/1984 | Bayne | 414/786 X |
| 4,449,885 | 5/1984 | Hertel et al. | 414/417 X |
| 4,457,661 | 7/1984 | Flint et al. | 414/417 X |
| 4,573,851 | 3/1986 | Butler | 414/417 X |

FOREIGN PATENT DOCUMENTS 19673 2/1979 Japan ................................. 414/287
99738 7/1980 Japan ................................. 414/287

Primary Examiner—Robert J. Spar
Assistant Examiner—Stuart J. Millman
Attorney, Agent, or Firm—Hubbard, Thurman, Turner & Tucker

[57] ABSTRACT

An apparatus is disclosed for the bulk transfer of pluralities of semiconductor wafers or slices from container to container. The device includes a stage adapted to receive a standard semiconductor wafer container and a plurality of vertical storage slots are provided above the stage. A pneumatically controlled elevation device is utilized to raise a plurality of semiconductor wafers from each container into the storage slots and an automatic wafer retainer is selectively rotated in response to each operation of the elevation device to retain the semiconductor wafers within the storage slots. In a preferred mode of the present invention the wafer retainer is designed to permit insertion and retention of a first plurality of semiconductor wafers into odd numbered storage slots while permitting insertion of a second plurality of semiconductor wafers into even numbered storage slots.

12 Claims, 12 Drawing Figures

SEMICONDUCTOR WAFER TRANSFER APPARATUS

BACKGROUND OF THE INVENTION

This invention relates in general to devices for the transfer and handling of semiconductor wafers or slices and in particular to devices for the bulk transfer and handling of pluralities of semiconductor wafers. Still more particularly, this invention relates to devices for the bulk transfer and handling of pluralities of semiconductor wafers which are suitable for utilization with automated handling systems.

The handling and manufacture of integrated circuit devices is a fast growing area of technical expertise. Since its introduction over twenty years ago the integrated circuit has become more and more commonplace in our everyday lives and the manufacturers of such circuits are continually searching for more efficient methods and apparatus for handling these devices during the various stages of manufacture.

Those skilled in the art of integrated circuit manufacture will appreciate that such devices are generally constructed by planar diffusion techniques on wafers or slices of monocrystalline silicon. These wafers are generally thin slices of pure silicon which are subjected to various diffusion steps, metallization steps and acid etching to create hundreds of identical integrated circuits on a single wafer. Photolithography and other techniques are utilized to ensure that each device on a given slice is identical and after all processing is complete each circuit is cut from the wafer and wire-bonded into a suitable package for utilization in electronic circuitry.

It is toward the more efficient handling of these semiconductor wafers that the present invention is directed, since each wafer represents a large investment in time and effect. Bulk transport of semiconductor wafers generally is accomplished utilizing a container or "boat" which includes a number of vertical slots for storing these disk-shaped semiconductor wafers in an "on-edge" position. These "boats" are standardized throughout the industry and each generally holds twenty-five or fifty wafers when fully loaded. Certain forms of treatment of the semiconductor wafers (specifically heat treatment) require different construction materials for the boat or container and transfer of a large number of wafers to or from different boat types is generally a manual operation and extremely tedious in nature. Additionally, it is common that manual transfer of semiconductor wafers in this manner can result in damage to the wafer or the circuitry disposed thereon. Recently, devices have been manufactured which will remove a plurality of semiconductor wafers from a boat and place those wafers in temporary storage for transfer to a second boat; however, these devices utilize manual latches or retainers to ensure that the semiconductor wafers are properly retained in temporary storage. The utilization of a manual operation such as a latch will occasionally result in an accident due to human error which may damage a large number or semiconductor wafers.

SUMMARY OF THE INVENTION

It is therefore one object of the present invention to provide an improved apparatus for the transfer of semiconductor wafers.

It is another object of the present invention to provide an improved apparatus for the bulk transfer of semiconductor wafers from a first container to a second container.

It is yet another object of the present invention to provide an improved apparatus for the bulk transfer of semiconductor wafers which is suitable for utilization with automated handling systems.

It is another object of the present invention to provide an improved apparatus for the bulk transfer of semiconductor wafers which is highly reliable and simple to maintain.

The foregoing objects are achieved as is now described. The device of the present invention includes a stage adapted to receive a standard semiconductor wafer container and a plurality of vertical storage slots are provided above the stage. A pneumatically controlled elevation device is utilized to raise a plurality of semiconductor wafers from each container into the storage slots and an automatic wafer retainer is selectively rotated in response to each operation of the elevation device to retain the semiconductor wafers within the storage slots. In a preferred mode of the present invention the wafer retainer is designed to permit insertion and retention of a first plurality of semiconductor wafers into odd numbered storage slots while permitting insertion of a second plurality of semiconductor wafers into even numbered storage slots.

BRIEF DESCRIPTION OF THE DRAWINGS

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
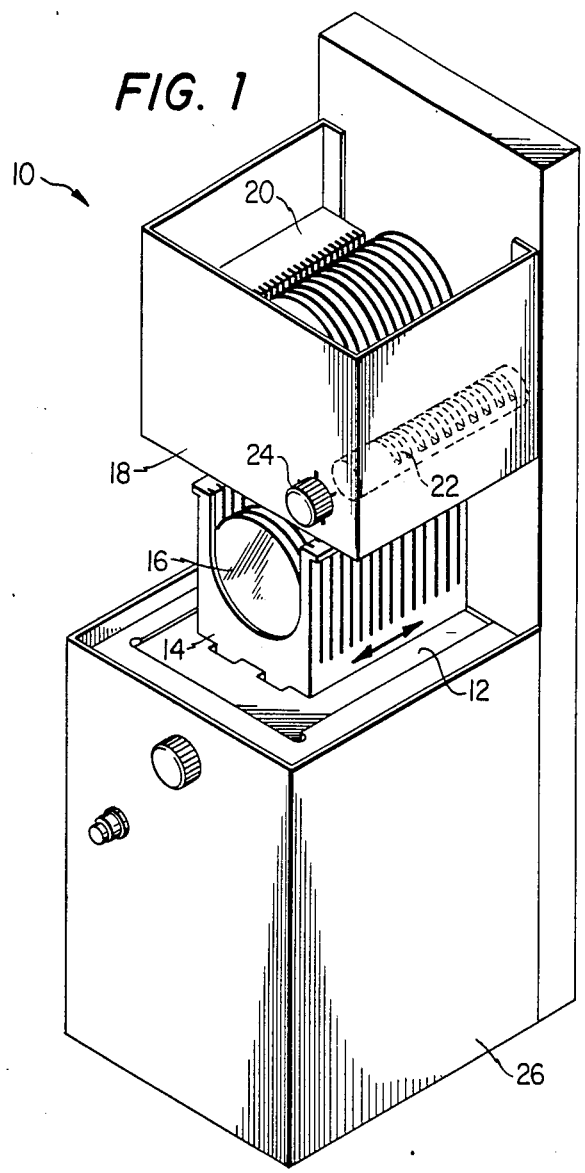
FIG. 1 is a perspective view of the novel wafer transfer apparatus of the present invention.

With reference now to the figures and in particular with reference to FIG. 1, there is depicted a perspective view of novel wafer transfer apparatus 10 of the present invention. As can be seen, apparatus 10 includes a stage 12 which is adapted to receive and support a semiconductor wafer container or "boat" 14 which contains a plurality of semiconductor slices or wafers 16 which are stored on edge in a plurality of vertical storage slots within boat 14. Those skilled in the art will appreciate that while disc shaped slices are depicted the transfer apparatus of the present invention will also function with square or rectangular slices of semiconductor material. In a preferred mode of the present invention, stage 12 includes means for indexing or moving boat 14 forward and backward in the direction indicated by the arrow in FIG. 1. This may be easily accomplishd utilizing an air cylinder or any standard electrical technique, such as a solenoid, and is utilized to align semiconductor wafers 16 under selected storage slots as will be described in detail herein.

Disposed above stage 12 is temporary storage area 18 including a plurality of vertical storage slots 20 which are adapted to receive semiconductor wafers 16. Also disposed within temporary storage area 18 is wafer retainer 22 which serves to retain semiconductor wafers 16 within storage slots 20. A knurled knob 24 can be utilized to selectively rotate wafer retainer 22; however, in a preferred mode of the present invention, wafer retainer 22 is automatically rotated in response to the elevation of a plurality of semiconductor wafers into storage slots 20.

Figure 2:
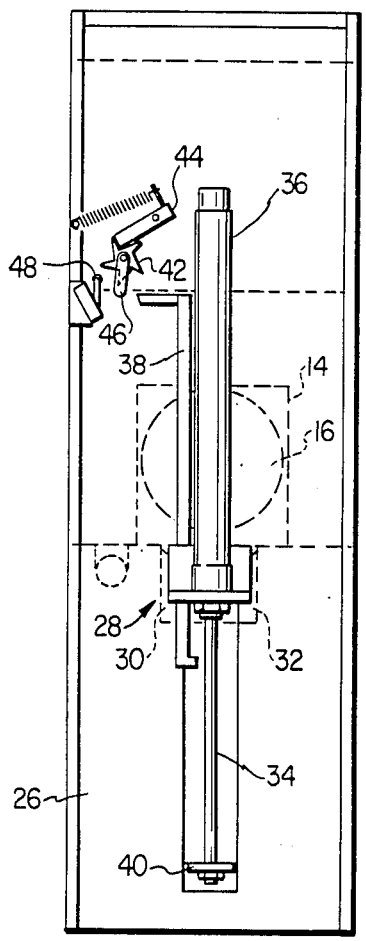
FIG. 2 is a partially sectional rear view of the novel wafer transfer apparatus of FIG. 1.
Figure 3:
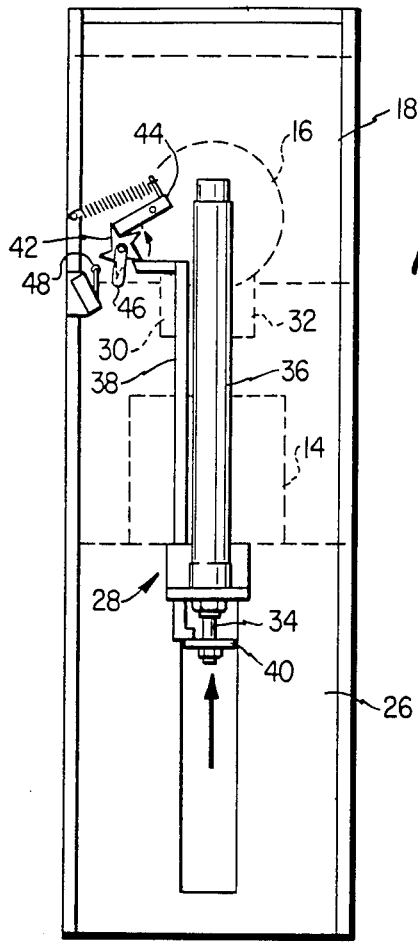
FIG. 3 is a sectional rear view of the novel wafer transfer apparatus of FIG. 1 which depicts the automatic operation of the wafer retention cam.

Referring now to FIGS. 2 and 3 the automatic rotation of wafer retainer 22 can be clearly illustrated. As depicted in FIGS. 2 and 3, base portion 26 of apparatus 10 includes an elevation device 28 designed to elevate semiconductor wafers 16 out of boat 14 and into temporary storage area 18. Elevation device 28 includes two coupled elongated slotted members 30 and 32 which are disposed beneath corresponding elongate openings in boat 14. Elongate slotted members 30 and 32 are coupled, in any manner well known in the art, to rod 34 of pneumatic cylinder 36. For the sake of clarity, the supply lines to pneumatic cylinder 36 have not been shown and those ordinarily skilled in the art will appreciate that cylinder 36 may also be implemented utilizing a hydraulic cylinder or other alternate techniques. Thus, as rod 34 is drawn upwardly into cylinder 36, slotted members 30 and 32 are raised through the openings in the bottom of boat 14 and serve to lift semiconductor wafers 16 upward. It should be noted that the slots provided in slotted members 30 and 32 will maintain the mutual alignment of semiconductor wafers 16 until such time as semiconductor wafers 16 engage wafer retainer 22 and storage slots 20 within temporary storage area 18.

A key component of elevation device 28 is trip lever 38 which is slidably coupled to the mounting point for cylinder 36. As can be seen in FIG. 3, as rod 34 approaches its highest postion, plate 40 will strike and raise trip lever 38. As lever 38 reaches its highest point it will strike gear 42, causing counter-clockwise rotation of gear 42 in conjunction with ratchet lever 44. Gear 42 is mounted on the exposed rearward end of wafer retainer 22 and thus causes wafer retainer 22 to rotate through a selected arc at each complete elevation of semiconductor wafers 16 on slotted members 30 and 32. Those skilled in the mechanical arts will appreciate that ratchet lever 44 will ensure only counter-clockwise rotation of gear 42 and that the shape of gear 42 can be modified to achieve practically any degree of rotation desired in response to each operation of elevation device 28. Also affixed to gear 42 is lever 46 which serves to operate switch 48 once during each full cycle of gear 42. Switch 48 is preferably utilized to actuate the indexing feature of stage 12 in an operation which will be described in detail below.

Figure 4:
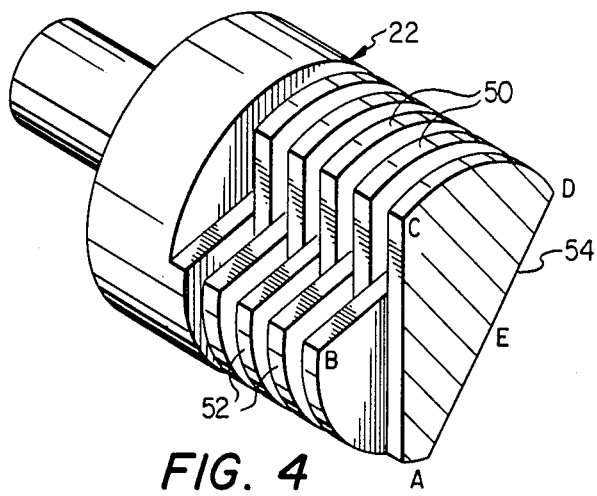
FIG. 4 is a perspective view of a section of the novel retention cam of the wafer transfer apparatus of FIG. 1.
Figure 5:
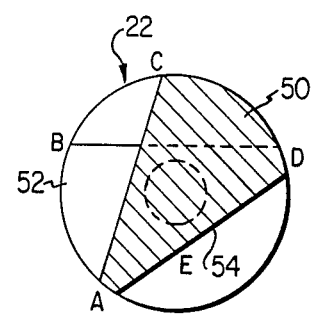
FIG. 5 is a sectional view of the novel wafer retainer of the wafer transfer apparatus of FIG. 1.

Referring now to FIGS. 4 and 5 there is illustrated a perspective and sectional view of one preferred embodiment of wafer retainer 22 of novel wafer transfer apparatus. As can be seen, wafer retainer 22 is machined to include a first plurality of lobes 50 and a second plurality of lobes 52. The spacing and number of lobes on wafer retainer 22 is determined by the spacing and number of storage slots in temporary storage area 18. Thus lobes 50 will correspond to the even numbered slots in temporary storage area 18 and lobes 52 will correspond to the odd numbered slots in temporary storage area 18. In a preferred embodiment of the present invention, temporary storage area 18 includes fifty storage slots and thus there are twenty-five lobes 50 and twenty-five lobes 52 on wafer retainer 22. In this manner, it is possible by positioning retention cam 22 at the periphery of semiconductor wafers 16, while semiconductor wafers 16 are disposed within temporary storage area 18, to selectively retain a group of semiconductor wafers in either the odd numbered or even numbered slots in temporary storage 18 utilizing lobes 50 or 52. Further, face 54 may be rotated into conjunction with the periphery of semiconductor wafers 16 to permit access or limit access to all storage slots within temporary storage area 18.

Figure 6:
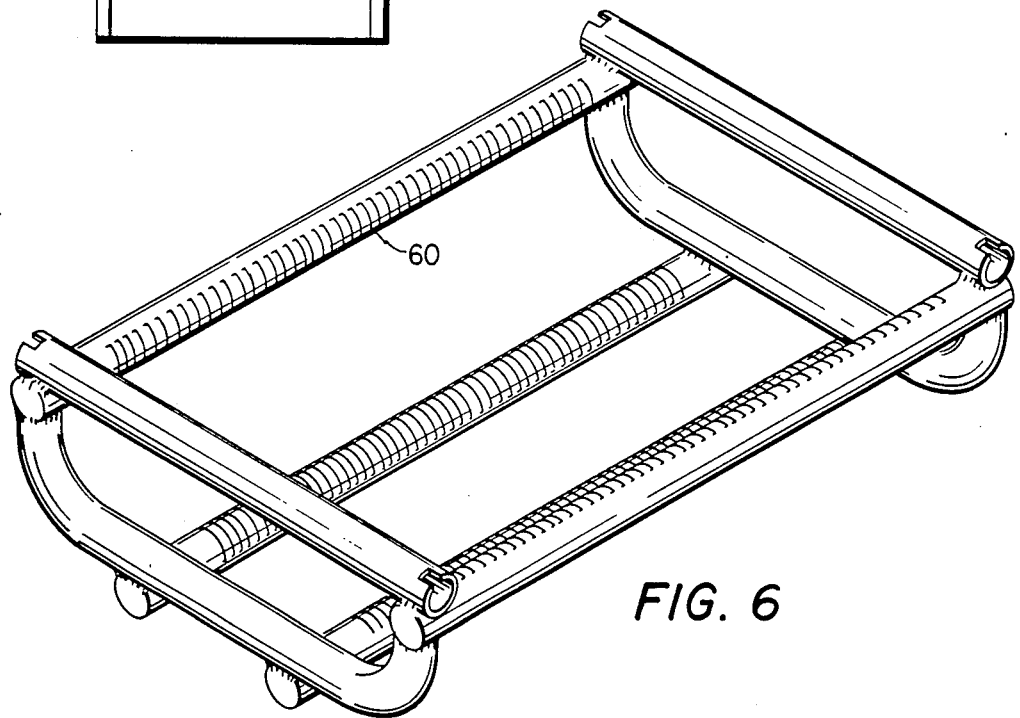
FIG. 6 is a perspective view of a quartz semiconductor wafer boat which may be utilized in conjunction with the present invention.

With reference now to FIGS. 6, 7A, 7B, 8A, 8B, 9A and 9B one application of apparatus 10 can be illustrated. A common problem encountered during the processing of semiconductor wafers is the bulk transfer of pluralities of semiconductor wafers from one storage boat to another. This problem occurs during the processing of semiconductor wafers when a group of semiconductor wafers must be subjected to a higher degree of heat than may be withstood by plastic storage boat 14. In such cases, it is common to transfer a plurality of semiconductor wafers to a high temperature storage boat such as storage boat 60 which is depicted in FIG. 6. Storage boat 60 is preferably constructed utilizing quartz or other high temperature resistant materials and typically encompasses storage slots for fifty semiconductor wafers. The fifty storage slots contained within quartz storage boat 60 are generally standard spacing in the industry and correspond exactly to the fifty storage slots within temporary storage area 18. Similarly, the twenty-five storage slots contained within plastic storage boat 14 are also industry standard spacing and are exactly twice the spacing between the storage slots within boat 60.

Figure 7A:
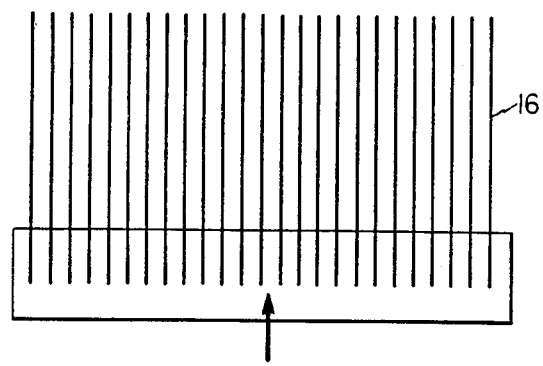
FIGS. 7A, 7B, 8A, 8B, 9A and 9B are schematic views which illustrate the operation of the wafer retainer of the novel wafer transfer apparatus of FIG. 1.
Figure 7B:
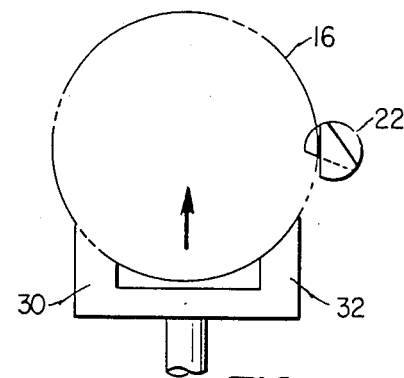
Figure 8A:
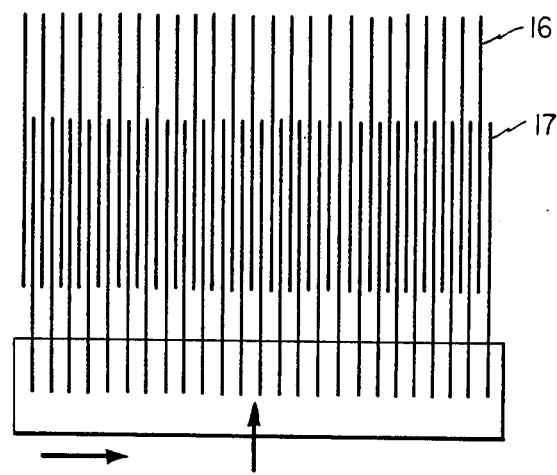
Figure 8B:
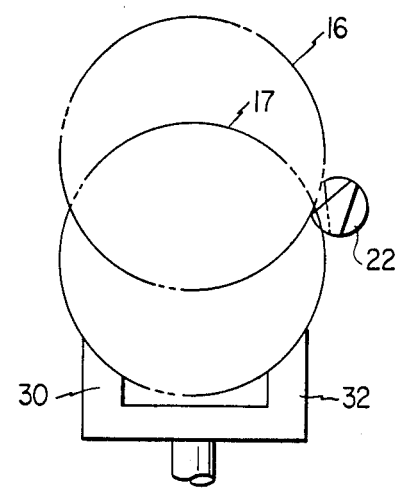
Figure 9A:
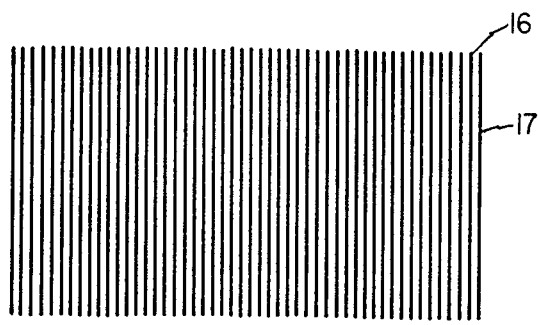
Figure 9B:
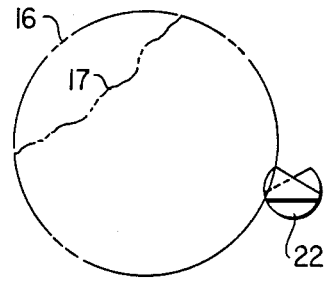

The novel wafer transfer apparatus 10 of the present invention can be utilized to simply and automatically transfer the contents of two plastic twenty-five storage boats into a single high temperature storage boat without relying on human operators to manually transfer the wafers. Referring now to FIGS. 7A, 7B, 8A, 8B, 9A and 9B, the aforementioned operation is schematically depicted. As seen in FIG. 7B, a first plurality of semiconductor wafers 16 is raised from a plastic storage boat 14 utilizing slotted members 30 and 32 and lifted into temporary storage area 18. As described above, the action of elevation device 28 serves to rotate wafer retainer 22 after semiconductor wafers 16 have been lifted beyond wafer retainer 22 and lobes 50 will then serve to retain that group of semiconductor wafers 16 within temporary storage area 18.

Next, stage 12 is indexed in a longitudinal manner, shifting a second plurality of semiconductor wafers 17 into alignment beneath the remaining slots within temporary storage area 18. Elevation device 28 is then actuated and slotted members 30 and 32 will then raise semiconductor wafers 17 into temporary storage area 18 and the automatic rotation of wafer retainer 22 in response to the elevation of semiconductor wafers 17 will retain semiconductor wafers 16 and 17 within temporary storage area 18.

High temperature storage boat 60 may then be placed on stage 12 and slotted members 30 and 32 elevated into temporary storage area 18 causing automatic rotation of wafer retainer 22 so that face 54 is adjacent the periphery of semiconductor wafers 16 and 17, and the entire group of fifty semiconductor wafers may then be lowered into boat 60 for heat treatment.

After heat treatment has been accomplished, the entire group of fifty semiconductor wafers may be elevated from boat 60 and inserted into temporary storage area 18. Wafer retainer 22 will then rotate to retain the entire group of semiconductor wafers within storage slots 20 utilizing one edge of face 54. Each subsequent operation of elevation device 28 will then permit twenty-five of the semiconductor wafers to be lowered out of temporary storage area 18 by means of slotted members 30 and 32.

In the manner described above, selective rotation of wafer retainer 22 can be utilized to retain a first group of semiconductor wafers within the odd numbered storage slots of temporary storage area 18 while permitting the insertion of a second group of semiconductor wafers into the even numbered storage slots of temporary storage area 18. Subsequent operations can then be utilized to remove or insert the entire group of fifty semiconductor wafers without relying upon manual handling of the semiconductors wafers or manual latches.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. One example of such a modification is the selection of various alternate shapes for wafer retainer 22. Those skilled in the art will appreciate that the depicted embodiment of wafer retainer 22 utilizes five different faces to perform five alternate operations. A simplified cam utilizing fewer faces can also be utilized to perform a simpler operation, i.e. transferring a single plurality of wafers to a second boat. It is therefore contemplated that the appended claims will cover any such modifications or embodiments that fall within the true scope of the invention.

What is claimed is:

1. Apparatus for receiving and storing at least two pluralities of semiconductor wafers comprising:
    a stage adapted to receive and support a container enclosing a plurality of semiconductor wafers;
    storage means disposed above said stage including a first plurality of slots for receiving and storing semiconductor wafers;
    elevation means disposed within said stage for elevating a plurality of semiconductor wafers from said container for insertion into said storage means; and
    retention means for retaining a first plurality of semiconductor wafers within the odd numbered ones of said first plurality of slots in response to the insertion of a first plurality of semiconductor wafers while permitting insertion of a second plurality of semiconductor wafers into the even numbered ones of said first plurality of slots and for retaining said first and second plurality of semiconductor wafers in said first plurality of slots in response to the insertion of said second plurality of semiconductor wafers, said retention means including an elongate shaft disposed adjacent to the periphery of said first and said second plurality of semiconductor wafers when said semiconductor wafers are disposed within said storage means, said shaft including means for selectively engaging said first and second plurality of semiconductor wafers.

2. Apparatus for receiving and storing at least two pluralities of semiconductor wafers according to claim 1 wherein said two pluralities of semiconductor wafers are disk shaped and wherein said container includes a second plurality of slots for receiving and storing disk shaped semiconductor wafers on edge.

3. Apparatus for receiving and storing at least two pluralities of semiconductor wafers according to claim 2 wherein said container includes at least one opening disposed in the lower surface thereof.

4. Apparatus for receiving and storing at least two pluralities of semiconductor wafers according to claim 3 wherein said elevation means includes two members disposed within said stage and adapted to be inserted upwardly into said at least one opening whereby said plurality of semiconductor wafers will be elevated out of said container.

5. Apparatus for receiving and storing at least two pluralities of semiconductor wafers according to claim 4 wherein said elevation means further includes a pneumatic ram coupled to said at least two members.

6. Apparatus for receiving and storing at least two pluralities of semiconductor wafers according to claim 1 wherein said retention means includes means for selectively rotating said elongate shaft in response to each operation of said elevation means.

7. Apparatus for receiving and storing at least two pluralities of semiconductor wafers according to claim 1 wherein said retention means includes means for releasing said first and said second plurality of semiconductor wafers in response to a selected operation of said elevation means.

8. Apparatus for receiving and storing at least two pluralities of semiconductor wafers according to claim 1 wherein said stage includes means for receiving and supporting a container enclosing a plurality of semiconductor wafers in a first and a second selected position.

9. Apparatus for receiving and storing at least two pluralities of semiconductor wafers according to claim 8 wherein said first selected position disposes a first plurality of semiconductor wafers directly beneath said odd numbered ones of said plurality of slots in said storage means.

10. Apparatus for receiving and storing at least two pluralities of semiconductor wafers according to claim 8 wherein said second selected position disposes a second plurality of semiconductor wafers directly beneath said even numbered ones of said plurality of lots in said storage means.

11. The apparatus for receiving and storing at least two pluralities of semiconductor wafers according to claim 1, wherein said shaft is rotatably mounted and said engaging means includes a plurality of axially spaced apart wafer engaging surfaces.

12. Apparatus for receiving and storing at least two pluralities of semiconductor wafers comprising:
    a stage adapted to receive and support a container enclosing a plurality of semiconductor wafers;
    storage means disposed above said stage including a first plurality of slots for receiving and storing semiconductor wafers;

elevation means disposed within said stage for elevating a plurality of semiconductor wafers from said container for insertion into said storage means; and retention means for retaining a first plurality of semiconductor wafers within the odd numbered ones of said first plurality of slots in response to the insertion of a first plurality of semiconductor wafers while permitting insertion of a second plurality of semiconductor wafers into the even numbered ones of said first plurality of slots and for retaining said first and second plurality of semiconductor wafers in said first plurality of slots in response to the insertion of said second plurality of semiconductor wafers, said retention means including an elongate shaft disposed adjacent to the periphery of said first and said second plurality of semiconductor wafers when said semiconductor wafers are disposed within said storage means and means for selectively rotating said elongate shaft in response to each operation of said elevation means.

* * * * *